(12) United States Patent
Bernauer

(10) Patent No.: US 9,373,945 B2
(45) Date of Patent: Jun. 21, 2016

(54) ELECTRICAL PENETRATION ARRANGEMENT FOR THE CONNECTION OF ELECTRICAL DEVICES IN CONTAINMENT STRUCTURES

(75) Inventor: Johann Bernauer, Tiefenbach (DE)

(73) Assignee: SCHOTT AG, Mainz (DE)

( * ) Notice: Subject to any disclaimer, the term of this patent is extended or adjusted under 35 U.S.C. 154(b) by 647 days.

(21) Appl. No.: 13/330,995

(22) Filed: Dec. 20, 2011

(65) Prior Publication Data
US 2012/0321029 A1   Dec. 20, 2012

(30) Foreign Application Priority Data
Dec. 20, 2010 (DE) .......................... 10 2010 055 177

(51) Int. Cl.
*E04C 2/52* (2006.01)
*H02G 3/22* (2006.01)
(Continued)

(52) U.S. Cl.
CPC ................ *H02G 3/22* (2013.01); *G21C 13/036* (2013.01); *G21F 7/005* (2013.01); *H05K 5/0247* (2013.01); *Y02E 30/40* (2013.01)

(58) Field of Classification Search
CPC ...... H01R 13/40; H01R 13/521; H05K 5/247; H02G 3/22; G21C 13/036; G21F 7/00
USPC .......... 376/203, 245–259, 293; 439/580, 589, 439/730, 935; 174/151
See application file for complete search history.

(56) References Cited

U.S. PATENT DOCUMENTS 3,520,989 A * 7/1970 Matthews et al. .... G21C 17/116
                                                                    174/151
3,780,204 A   12/1973 Oliver
(Continued)

FOREIGN PATENT DOCUMENTS

DE   23 17 853   10/1973
DE   23 42 361    3/1974
(Continued)

OTHER PUBLICATIONS

Conduit Junction Boxes Inside Containment, Tennessee Valley Authority Jul. 12, 1979. Accession No. ML073520866, publicly available here: <http://www.nrc.gov/site-help/search.cfm?q= ML073520866&s=+ >.*

*Primary Examiner* — Jack W Keith
*Assistant Examiner* — Lily C Garner
(74) *Attorney, Agent, or Firm* — Pearl Cohen Zedek Latzer Baratz LLP

(57) ABSTRACT

An electrical penetration arrangement through the wall of a containment structure, comprising a pipe penetration having a pipe which is disposed in the wall of a containment structure, penetrating the wall, so that a first opening of the pipe is disposed outside of the containment structure, and a second opening is disposed inside the structure. Power feedthroughs are disposed in the pipe penetration having conductors sealed along their axial direction by a hermetically sealing, electrically insulating material, in which cables coming from outside can be connected to first conductor ends, and cables coming from inside the containment structure can be connected to second conductor ends. Power feedthroughs are fastened in the pipe of the pipe penetration and sealed by hermetically sealing material, so that the power feedthroughs form a hermetically sealing barrier, and the first conductor ends are disposed in the interior of the pipe.

9 Claims, 3 Drawing Sheets

(51) Int. Cl.
   *G21C 13/036* (2006.01)
   *G21F 7/005* (2006.01)
   *H05K 5/02* (2006.01)

(56) References Cited

U.S. PATENT DOCUMENTS 4,334,729 A * 6/1982 Allen et al. ................... 439/550
4,553,812 A * 11/1985 Kojiro et al. .................. 385/138
5,750,926 A * 5/1998 Schulman et al. ............ 174/564
7,927,139 B2 * 4/2011 Bernauer ............... H01R 13/53
   439/589

FOREIGN PATENT DOCUMENTS

DE 1 55 123 5/1982
DE 2 11 023 6/1984

* cited by examiner

ELECTRICAL PENETRATION ARRANGEMENT FOR THE CONNECTION OF ELECTRICAL DEVICES IN CONTAINMENT STRUCTURES

PRIOR APPLICATION DATA

The present application claims priority from prior German application 10 2010 055 177.5-54 filed Dec. 20, 2010, incorporated by reference herein in its entirety.

FIELD OF THE INVENTION

The invention relates in general to the technical field of electrical feedthroughs. Specifically, the invention relates to a system for the penetration of electrical cables into and out of containment structures.

DESCRIPTION

In containment or pressure structures, such as a reactor containment structure of a nuclear power plant, electrical connections are generally established using hermetically sealed electrical penetrations. Depending on the complexity of the electrical and/or electronic devices, a large number of cables are necessary. However, at the same time, in order to avoid potential leaks, the number of openings to be sealed in the containment structure should be limited.

This typically means that a large number of cables are fed through one pipe penetration in the containment structure. The problem here is that a large amount of space is required outside of the containment structure for the connection area for the large number of cables. This is particularly disadvantageous if the available space outside of the containment structure is limited. This occurs, for instance, when a reactor containment structure is surrounded by another enclosure, and the space between the outside of the reactor container and the enclosure must still be passable.

SUMMARY

Therefore, the problem addressed by the invention is to provide a penetration system with which it is possible to pass through a large number of cables, while also taking up very little space outside of the containment structure. At the same, the cabling should remain manageable in order to facilitate maintenance. This objective is solved by the subject matter of the independent patent claims. Advantageous embodiments and further developments of the invention are specified in the dependent claims.

Accordingly, the invention provides an electrical penetration arrangement through the wall of a containment structure. The electrical penetration arrangement comprises a pipe penetration having a pipe, which is disposed in the wall of a containment structure, penetrating its wall so that a first opening of the pipe is disposed at the outside of the containment structure and a second opening of the pipe is disposed at the inside the containment structure. In other words, the pipe creates a connection between the interior and the surroundings of the containment structure.

Furthermore, the electrical penetration arrangement comprises a plurality of power feedthroughs, or electrical feedthroughs, disposed in the pipe penetration having conductors, sealed along their axial direction by a hermetically sealing, electrically insulating material, with which cables coming from outside of the containment structure can be connected to first conductor ends, and cables coming from inside of the containment structure can be connected to second conductor ends.

The power feedthroughs are fastened sealingly in the pipe of the pipe penetration using the hermetically sealing flange system such that the power feedthroughs form a hermetically sealing barrier along the axial direction. The first conductor ends are disposed at a distance to the first opening in the interior of the pipe.

Electrical conductors are connected to the first conductor ends, which are disposed in the interior of the pipe. Electrical cables are inserted through the wall of a junction box that is fastened to the outside of the pipe. The electrical conductors and the electrical cables are connected, or electrically connected, together using connectors. Here, the connectors are disposed within the pipe along the axial section between the first opening and the first conductor ends of the power feedthroughs.

Due to the design according to the invention, the connections to the electrical connectors are relocated to the interior of the pipe. In contrast, up until now, the cabling with the electrical connectors was located in the junction box outside of the pipe of the pipe penetration. With a large number of cables to be connected, this consequently required a correspondingly large space for the connection boxes. Thus, such junction boxes typically extend more than one meter beyond the end of the pipe.

In contrast to this, for typical application cases, the junction boxes of a penetration arrangement according to the invention have a length of 0.75 meters or less, preferably at most 60 cm measured in the axial direction of the pipe of the pipe penetration.

The invention relates to an electrical penetration arrangement through the wall of a containment structure, comprising a pipe penetration having a pipe which is disposed in the wall of a containment structure, penetrating the wall, so that a first opening of the pipe is disposed outside of the containment structure, and a second opening of the pipe is disposed inside the containment structure; a plurality of power feedthroughs disposed in the pipe penetration having conductors sealed along their axial direction by a hermetically sealing, electrically insulating material, in which cables coming from outside of the containment structure can be connected to first conductor ends, and cables coming from inside the containment structure can be connected to second conductor ends, and wherein the power feedthroughs are fastened in the pipe of the pipe penetration, sealed by means of the hermetically sealing material, so that the power feedthroughs form a hermetically sealing barrier along the axial direction of the pipe, and wherein the first conductor ends are disposed in the interior of the pipe at a distance to the first opening, and wherein electrical conductors are connected to the first conductor ends, and wherein a junction box is fastened to the outside of the pipe and electrical cables are fed through the wall of said box, and the electrical conductors and the electrical cables are connected together using connectors, which are disposed within the pipe along the axial section between the first opening and the first conductor ends of the power feedthroughs.

BRIEF DESCRIPTION OF THE DRAWINGS

The invention is explained in greater detail below based on example embodiments and in reference to the accompanying figures. In the process, the same or similar elements are designated with the same reference characters. They show.

DETAILED DESCRIPTION

Figure 1:
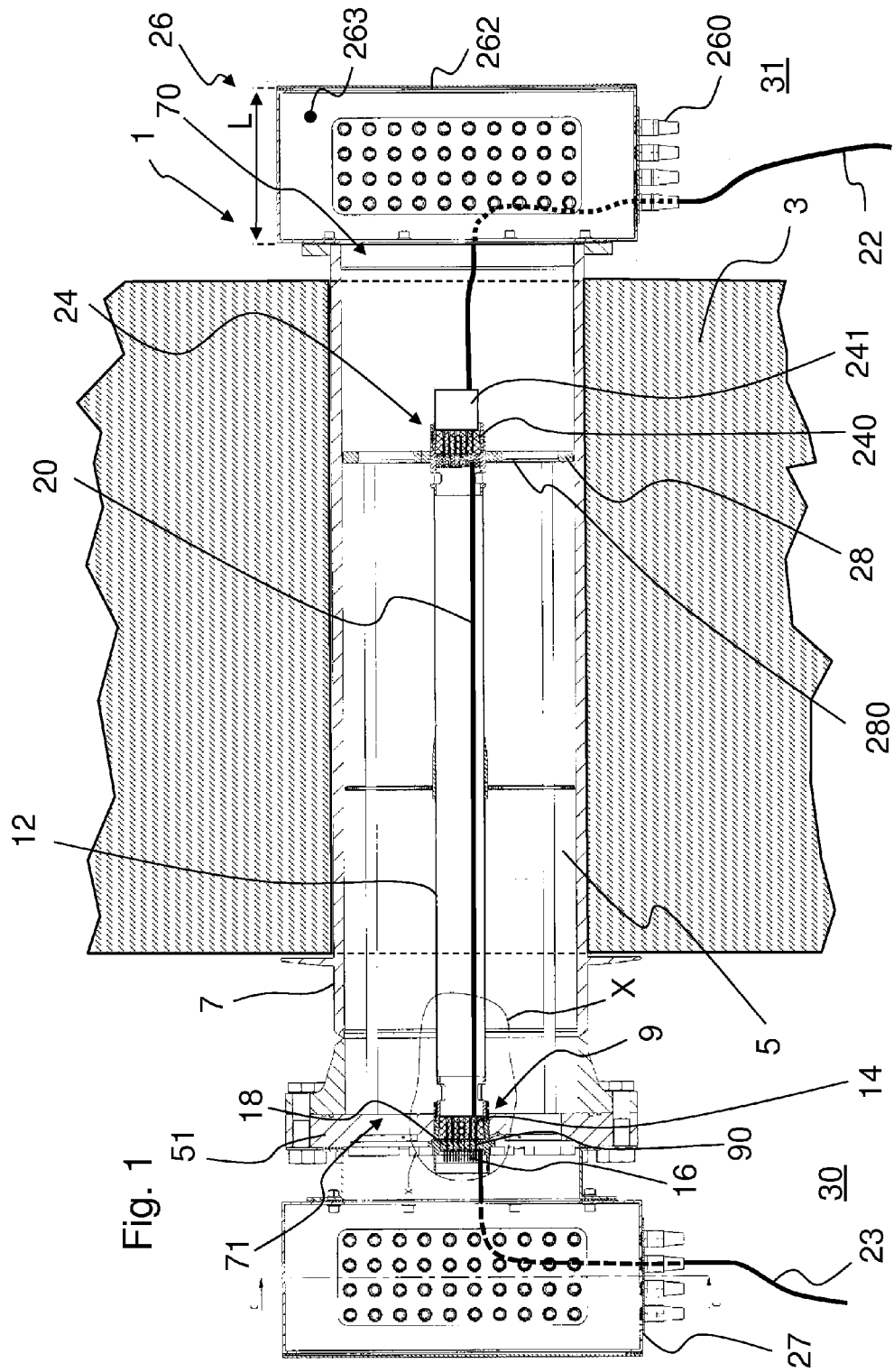
FIG. 1 a sectional view through the wall of a containment structure.

FIG. 1 shows a cross sectional view of one embodiment of a penetration module 1 according to the invention. The penetration module 1 is disposed in the wall 3 of a containment structure and serves to conduct electrical energy and/or electrical signals into and/or out of the containment structure. For this purpose, the penetration module 1 comprises a pipe penetration 5 having a pipe 7, which is disposed penetrating the wall 3, and which connects the interior 30 of the containment structure to the surroundings 31 of the containment structure. For this purpose, a first opening 70 of the pipe 7 is disposed at the outside of the containment structure, and a second opening of the pipe 7 is disposed at the inside of the containment structure.

In addition, one or more power feedthroughs 9 are disposed in the pipe penetration 5. These power feedthroughs comprise conductors 90 having first conductor ends 14 and second conductor ends 16 that are electrically insulated from the pipe 7 and sealed along their axial direction by a hermetically sealing, electrical insulating material 18, and cables coming from outside of the containment structure can be connected to first conductor ends 14, and electrical conductors coming from inside the containment structure can be connected to second conductor ends 16. In general, without restriction to the embodiment shown in FIG. 1, glass is preferred as a hermetically sealing material. In particular, the hermetically sealing material 18 can be produced as a glass seal in a metal mount, particularly in the shape of a metal flange.

Figure 2:
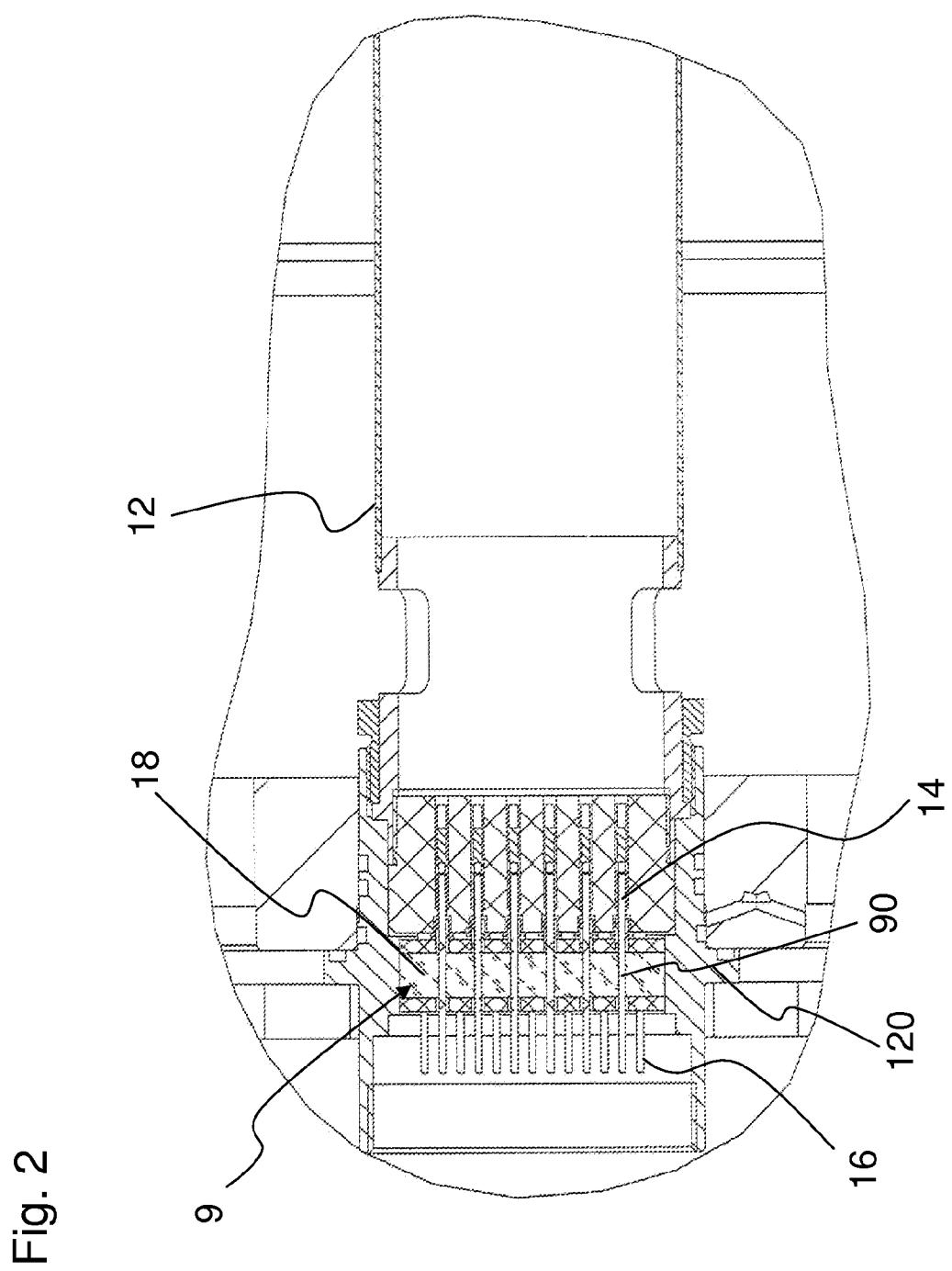
FIG. 2 an enlarged section of feedthroughs of the sectional view shown in FIG. 1, and FIG. 3 a cross sectional view of a variant of the embodiment shown in FIG. 1 having a power feedthrough comprised of two sealing barriers.

For clarification of the design of the power feedthroughs 9, the section having the power feedthroughs labeled with "X" is shown again enlarged in FIG. 2.

The power feedthroughs 9 are fastened in the pipe 7 of the pipe penetration 5, sealed by means of the hermetically sealing material 18, so that the power feedthroughs 9 form a hermetically sealing barrier along the axial direction of the pipe 7, so that gas exchange through the pipe 7 is avoided. In the embodiment of the invention shown in the FIGS. 1 and 2, the power feedthroughs 9 are not, however, directly connected to the wall of the pipe 7 using the hermetically sealing material 18. Rather, the power feedthroughs 9 are disposed in a flange 120 of a power feedthrough module 12. The power feedthrough module 12, in turn, is fastened sealingly to the flange 120 at the pipe 7 of the pipe penetration 5.

The first conductor ends 14 of the conductors 90 are disposed in the interior of the pipe 7 at a distance from the first opening 70. This separation distance of the conductor ends 14, for instance as in the embodiment shown in FIG. 1, can be so large in particular that the conductor ends 14 are no longer reachable at arm's length from the opening 70. Therefore, the cabling from the opening 70 is not performed manually directly to the conductors 90 of the feedthroughs 9. The separation distance of the conductor ends 14 to the first opening 70 of the pipe 7 is typically more than 1 meter.

Rather, the connections are moved in the direction toward the first opening 70 of the pipe 7 via electrical conductors 20 connected to the conductor ends 14. Specifically, the cabling with the electrical cables 22 to be connected from the surroundings 31 occurs using connectors 24.

The electrical cables 22 are placed through the wall of a junction box 26 fastened at the outside of the pipe 7.

The cabling to the connectors 24 does not occur in the junction box 26, but rather, according to the invention, within the pipe 7 between the first opening 70 and the position of the first conductor ends 14 of the power feedthroughs 9.

For a clear overview, only a single cable 22 is represented in FIG. 1. In fact, typically a large number of cables, in general more than 500, often even more than 1000 cables are attached. If the cabling of the containment structure-side and the outside connections takes place in junction boxes, then significant space is required due to the large number of electrical connectors. However, because this space is no longer required for the arrangement according to the invention, the junction boxes can be kept significantly smaller in their overall dimensions than in previous embodiments. In particular, the length L of the junction box measured in the axial direction of the pipe 7 can amount to significantly less than 1 meter, for example about half of a meter.

The junction box 26 itself is not used, or at least not exclusively used, for the purpose of providing the space for the cabling, but rather above all, it is used to guide the cables 22 from the surroundings of the containment structure in an orderly manner to the pipe penetration 5 and to optionally provide a support and a strain relief for the cables 22. For this purpose, cable guides 260, disposed in the wall of the junction box 26, can preferably also be formed as strain reliefs. The cables 22 are inserted through the cable guides 260 into the junction box.

In order to create a particularly space-saving arrangement of the junction box 26 and the cables 22 inserted therein, a preferred further development of the invention provides that the junction box 26 comprises a front wall 262 opposite from the first opening 70 and a side wall 263, where the side wall 263 extends between the first opening 70 and the front wall. In this case, as shown in FIG. 1, the electrical cables 22 are inserted through the side wall 263 into the junction box 26. In the example shown in FIG. 1, the junction box is rectangular. Accordingly, the side wall 263 here comprises several side walls. It is also possible to provide a cylindrical junction box 26, for example. In this case, the side wall 263 is formed by the lateral surface of the cylindrical junction box. Independent of the specific shape of the junction box, the insertion of the electrical cables 22 into the junction box 26 occurs, according to this further development, crosswise to the longitudinal direction of the pipe 7.

The connectors 24 are preferably disposed at a separation distance, in the range of 20 to 60 cm, to the first pipe opening 70, measured in axial direction of the pipe 7. This provides an easy accessibility of the connectors at an arm's length, so that the cabling work is easy to perform despite the arrangement of the connectors in the interior of the pipe 7.

Preferably plug connectors, butt connectors, cable lugs, clamps, multipole connectors, and electrical couplings are used as connectors 24. A protective insulation by means of shrink tubing and appropriately durable clamps or plugs are used if an electrical function is required under extreme environmental conditions.

According to another further development of the invention, a support plate 28 is provided in order to absorb vibrational and tensile forces and to provide an ordered and clear arrangement of the connector 24. This is disposed in the interior of the pipe 7.

In the example shown in FIG. 1, the electrical connectors 24 each have two parts, of which the connector part 240, which is connected to the electrical conductor 20, is fastened to the support plate 28. In this case, the cabling is produced by the connection of the connector part 240 to the connector part 241 disposed at the cable 22.

According to another embodiment of the invention, the connectors 24 can be formed one-piece as a clamp or terminal strip fastened to the support plate. In this case, the ends of the electrical cables, which are preferably equipped with cable lugs or end sleeves, are fastened in the clamps or terminal strips to make the electrical connections.

The support plate 28 can also be used solely for supporting the electrical conductors 20. In this case too, the connectors 24 are preferably disposed directly at the support plate.

Common to all embodiments of the support plate 28 is that it comprises the openings 280, through which the electrical connections are fed between the conductor ends 14 and the cables 22, and that the connectors are disposed in the support plate 28.

In many cases, different types of electrical connections are required. Accordingly, different connectors 24 can also be present in one pipe penetration 5. For example, signal or data lines can be placed together with power supply lines within one pipe penetration. Accordingly, different connectors, such as clamps or terminal strips with butt connectors, can also be combined together as connectors 24 within a pipe penetration.

As is further seen in the embodiment of the invention shown in FIG. 1, a junction box 27 is also provided in the interior 30 of the structure. Cables 23 from the interior 30 are placed through this junction box to the second conductor ends 16 of the feedthroughs 9 and are connected to them. The junction box 27 can be designed in the same structural shape as the outer junction box 26.

The power feedthroughs 9, as also shown in the embodiment in FIG. 1, are preferably disposed near the second, interior opening 71 of the pipe penetration 5. Specifically, the power feedthroughs 9 and the flange 120 of the power feedthrough module 12 are fastened directly, sealed in an interior connection flange 51. Generally, in a preferred further development of the invention, the power feedthroughs 9 are disposed closer to the second opening 71 than to the first opening 70, and the separation distance to the second opening 71 is less than the separation distance to the first opening 70.

Figure 3:
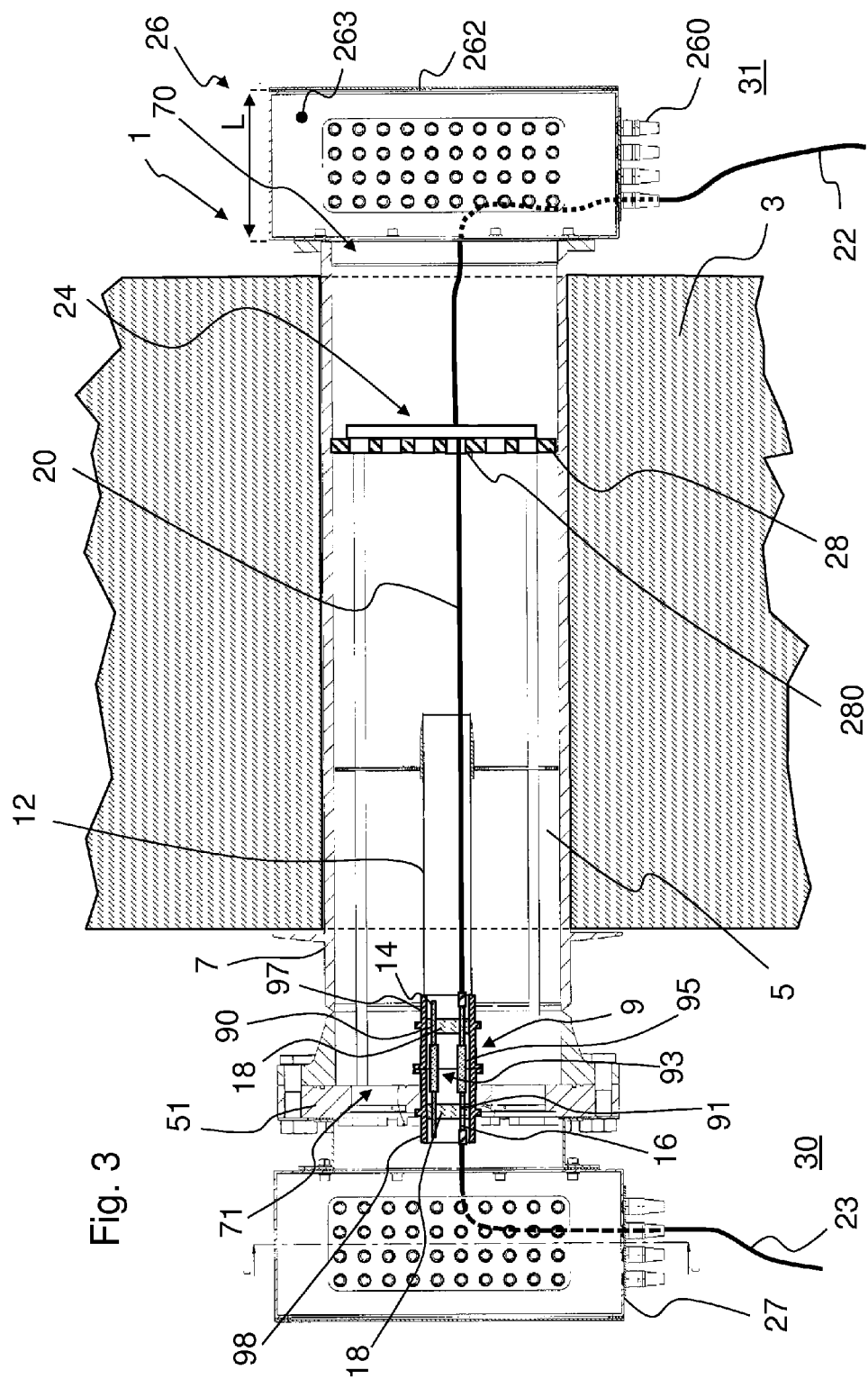

FIG. 3 shows a variant of the embodiment shown in FIG. 1. A feature of this variant is based on the use of double-walled power feedthroughs 9. These comprise a first housing element 97 and a second housing element 98, in each of which is disposed a hermetically sealing, electrically insulating material 18, again preferably in the form of a glass seal. In each case, conductors 90, 91 are guided through the hermetically sealing, electrical insulating material 18 of both housing elements 97, 98.

The housing elements 97, 98 are fastened together, sealed and therefore enclose a hermetically sealed interior 93 due to the hermetically sealing material 18. The conductors 90, 91 extend into the interior 93. The conductors 90 of the first housing element 97 are electrically connected to the conductors 91 of the second housing element 98. Connection rods 95 can be used, for example, where the electrical contact is formed in an axially movable manner along the conductors 90, 91. For this purpose, the conductors ends or the connection rods 95 extending into the interior 93 are equipped with sockets.

In this embodiment, the conductors 90 extending out of the first housing element 97 form the first conductor ends 14 of the power feedthroughs 9, and the conductors 91 extending out of the second housing element 98 correspondingly form the second conductor ends 16.

For the sealed connection of the two housing elements 97, 98, the housing elements 97, 98 are preferably flanged together. It is also possible to weld them together, for example.

In contrast to the example shown in FIG. 1, the tubular penetration module 12 here ends before the support flange, for example. The electrical conductors 20, electrically connected to the first conductor ends 14 of the penetration 9, accordingly extend out of the penetration module 12. Support or guiding elements can be provided for the electrical conductors 20, if needed, between the power feedthrough module and the support plate 28. In another difference in comparison to the embodiment shown in FIG. 1, the connector 24 is formed as a terminal strip, in which the electrical conductors 20 and the electrical cables coming from outside are connected together by clamp connections.

It is obvious to the person skilled in the art that the invention is not limited to the example embodiments as shown in the Figures. Rather, the features of the example embodiments, insofar as they are different, can also be exchanged or combined. Furthermore, variously depicted features are not mandatory. For example, pipe-shaped connection modules 12 are advantageous, but not compulsory. The differing connectors 24 according to FIG. 1 and FIG. 3 can likewise be exchanged or also combined.

The invention is suited in particular for penetration of electrical connections through the wall of a containment structure of a nuclear power plant. Additionally, other containment structures in which there are hazardous substances of any type can be equipped with the arrangement according to the invention. Thus, the embodiment shown for example in FIG. 3, is particularly suited for cases where a pressure drop is present between the interior 30 of the containment structure and its surroundings 31, or where a strict spatial separation is required. The double-walled embodiment of the penetration here makes it possible to be able to detect a leak in the penetration by connecting a gas detector in the interior 93.

LIST OF REFERENCE CHARACTERS 1 electrical penetration arrangement
3 containment structure wall
5 pipe penetration
7 pipe from 5
9 power feedthrough
12 penetration module
14 first conductor ends
16 second conductor ends
18 hermetically sealing material
20 electrical conductor
22 electrical cable, cable
24 connector
26 junction box
27 junction box in the interior of 30 of the containment structure
28 support plate
30 interior of the containment structure
31 surroundings of the containment structure
51 interior connection flange of 5
70 first opening of the pipe 7
71 second opening of the pipe 7
90, 91 conductor from 9
93 interior of a double-walled power feedthrough
97, 98 housing elements from 9
120 flange from 12 with power feedthroughs
240 first connector part
241 second connector part 260 cable guide, strain relief
262 front wall of 26
263 side wall of 26
280 openings in 28

The invention claimed is:

1. An electrical penetration arrangement through a wall of a containment structure, comprising:
   a) a pipe penetration disposed in the wall and penetrating the wall,
   b) a pipe arranged axially within the pipe penetration, a first opening of the pipe being disposed outside the containment structure and a second opening of the pipe being disposed inside the containment structure, so that the pipe connects the interior and the surroundings of the containment structure;
   c) at least one power feedthrough module arranged axially within the pipe with
      i) two axially opposed ends,
      ii) electrical conductors arranged axially between the ends, and
      iii) a flange at each end fastening the power feedthrough module to the pipe;
   d) at least one power feedthrough arranged at one end or at both ends of the power feedthrough module, the power feedthrough
      i) having axially disposed conductors that are connectable to the electrical conductors of the power feedthrough module,
      ii) having an electrically insulating, hermetically sealing material at each end fastening sealingly the power feedthrough to the power feedthrough module, and
      iii) being axially guided through the sealing material, so that the power feedthrough module forms axially a hermetically sealing barrier avoiding gas exchange through the pipe;
   e) a junction box fastened outside of the pipe having electrical cables which are fed through the junction box; and
   f) connectors arranged between the power feedthrough module and the junction box, wherein
      i) the connectors are formed as plug connectors, butt connectors, cable lugs, clamps, multipole connectors, or electrical couplings,
      ii) the connectors are disposed inside of the pipe, at a distance to the first opening of the pipe, and
      iii) the connectors connect the electrical conductors inside of the power feedthrough module and the electrical cables of the junction box outside of the pipe.

2. The electrical penetration arrangement according to claim 1, wherein
   the junction box comprises a length of 0.75 meters or less measured in the axial direction of the pipe of the pipe penetration.

3. The electrical penetration arrangement according claim 1, wherein the distance from the first conductor ends to the first opening of the pipe amounts to more than 1 meter.

4. The electrical penetration arrangement according to claim 1, wherein the distance of the connectors to the first pipe opening, measured in the axial direction of the pipe, lies in the range of 20 to 60 centimeters.

5. The electrical penetration arrangement according to claim 1, wherein the electrical cables are inserted into the junction box transverse to the longitudinal direction of the pipe.

6. The electrical penetration arrangement according to claim 1, comprising a support plate disposed in the pipe of the pipe penetration that comprises openings through which the electrical connections extend between the conductor ends and the electrical cables, wherein the connectors are disposed at the support plate.

7. The electrical penetration arrangement according to claim 1, wherein the power feedthrough is disposed closer to the second opening than to the first opening of the pipe.

8. The electrical penetration arrangement according to claim 1, wherein
   the feedthroughs are double-wall power feedthroughs, in which a hermetically sealing, electrically insulating material is disposed in each of two housing elements through which conductors are fed, wherein
   the housing elements enclose a hermetically sealed interior, into which the conductors extend, wherein
   the conductors of the first housing element are electrically connected to the conductors of the second housing element, and wherein
   the conductors extending out of the first housing element form the first conductor ends of the penetration, and the conductors extending out of the second housing element form the second conductor ends of the penetration.

9. The electrical penetration arrangement of claim 1, the electrical penetration arrangement penetrating through the wall of a containment structure of a nuclear power plant.

* * * * *